US007738621B2

(12) United States Patent
Yoon et al.

(10) Patent No.: US 7,738,621 B2
(45) Date of Patent: Jun. 15, 2010

(54) COUNTER WITH OVERFLOW PREVENTION CAPABILITY

(75) Inventors: Dae-Kun Yoon, Kyoungki-do (KR); Kyung-Hoon Kim, Kyoungki-do (KR); Dae-Han Kwon, Kyoungki-do (KR); Taek-Sang Song, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 27 days.

(21) Appl. No.: 12/005,933

(22) Filed: Dec. 28, 2007

(65) Prior Publication Data

US 2009/0086881 A1 Apr. 2, 2009

(30) Foreign Application Priority Data

Sep. 28, 2007 (KR) ...................... 10-2007-0098190

(51) Int. Cl.
*G06M 3/00* (2006.01)
*H03K 21/40* (2006.01)

(52) U.S. Cl. .............................. 377/51; 377/28; 377/31

(58) Field of Classification Search ................... 377/28, 377/31, 51
See application file for complete search history.

(56) References Cited

U.S. PATENT DOCUMENTS

| | | | | |
|---|---|---|---|---|
| 3,962,565 A * | 6/1976 | Guyen-Phuoc | ............... | 377/55 |
| 4,546,487 A * | 10/1985 | Dackow | ...................... | 377/51 |
| 5,157,701 A * | 10/1992 | Parker | ......................... | 377/39 |
| 5,199,052 A * | 3/1993 | Fujita | .......................... | 377/20 |
| 5,303,279 A * | 4/1994 | Fujii | ........................... | 377/51 |
| 5,666,390 A * | 9/1997 | Morzano | ..................... | 377/52 |

FOREIGN PATENT DOCUMENTS

| | | |
|---|---|---|
| JP | 402189026 | * 7/1990 |
| JP | 04-294654 | 10/1992 |
| JP | 405343986 | * 12/1993 |
| JP | 11-214984 | 8/1999 |
| JP | 2002-124882 | 4/2002 |
| KR | 0145893 | 9/1998 |

OTHER PUBLICATIONS

Notice of Allowance issued for Korean Application No. 10-2007-0098190 on Aug. 31, 2009 (1 page).

* cited by examiner

*Primary Examiner*—Tuan Lam
(74) *Attorney, Agent, or Firm*—Blakely, Sokoloff, Taylor & Zafman

(57) ABSTRACT

A counter with overflow prevention capability includes a counting unit configured to count an output code in response to an input signal and an overflow preventing unit configured to control the counting unit to stop counting the output code when a current value of the output code is a maximum value but a previous value thereof is not the maximum value.

21 Claims, 6 Drawing Sheets

COUNTER WITH OVERFLOW PREVENTION CAPABILITY

CROSS-REFERENCE TO RELATED APPLICATIONS

The present invention claims priority of Korean patent application number 10-2007-0098190, filed on Sep. 28, 2007, which is incorporated by reference in its entirety.

BACKGROUND OF THE INVENTION

The present invention relates to a counter for various semiconductor devices and logic circuit systems, and more particularly, to a counter that can prevent a code overflowing.

An overflow occurs when a counter counts a code as described below with reference to FIGS. 1 to 3.

FIG. 1 is a block diagram of a conventional N-bit counter.

Referring to FIG. 1, the conventional counter counts a code OUT<0:N-1> in response to a flag signal FLAG and a strobe signal STROBE. The strobe signal STROBE is a signal that strobes the counter. The counter increases or decreases a code value whenever the strobe signal STROBE is activated. The flag signal FLAG is a signal that instructs the counter to increase or decrease the code value. The counter increases the code value when the strobe signal STROBE is inputted while the flag signal FLAG is at a logic high level. On the other hand, the counter decreases the code value when the strobe signal STROBE is inputted while the flag signal FLAG is at a logic low level. In FIG. 1, an enable signal ENABLE is a signal that enables or disables the operation of the counter.

FIG. 2 is a timing diagram illustrating a high overflow of the counter.

Referring to FIG. 2, if the strobe signal STROBE is continuously inputted while the flag signal FLAG is at a logic high level, the code value of the code OUT<0:N-1> increases to "111 . . . 1". Thereafter, if the code value is increased one more time, the code value of the code OUT<0:N-1> becomes "000 . . . 0". This phenomenon is called a high overflow of the counter.

FIG. 3 is a timing diagram illustrating a low overflow of the counter.

Referring to FIG. 3, if the strobe signal STROBE is continuously inputted while the flag signal FLAG is at a logic low level, the code value of the code OUT<0:N-1> decreases to "000 . . . 0". Thereafter, if the code value is decreased one more time, the code value of the code OUT<0:N-1> becomes "111 . . . 1". This phenomenon is called a low overflow of the counter.

The overflow of the code may output a wrong result code OUT<0:N-1> if an input value is more than or less than a value that can be expressed with N bits. Therefore, there is a need for a circuit that can stop increasing or decreasing the code OUT<0:N-1> of the counter from "111 . . . 1" or "000 . . . 0".

SUMMARY OF THE INVENTION

Embodiments of the present invention are directed to providing a counter with an overflow prevention capability.

In accordance with an aspect of the present invention, there is provided a counter includes a counting unit configured to count an output code in response to an input signal and an overflow preventing unit configured to control the counting unit to stop counting the output code when a current value of the output code is a maximum value but a previous value thereof is not the maximum value.

DESCRIPTION OF SPECIFIC EMBODIMENTS

Hereinafter, a counter with an overflow prevention capability in accordance with the present invention will be described in detail with reference to the accompanying drawings.

Figure 4:
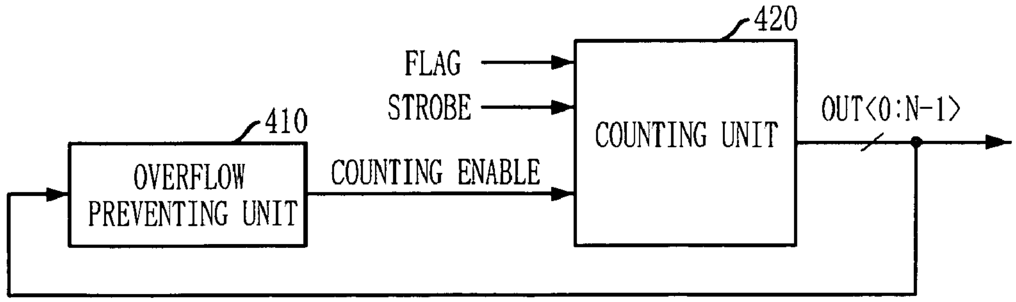
FIG. 4 is a block diagram of a counter in accordance with an embodiment of the present invention.

FIG. 4 is a block diagram of a counter in accordance with an embodiment of the present invention.

Referring to FIG. 4, the counter includes an overflow preventing unit 410 and a counting unit 420. The counting unit 420 counts an output code OUT<0:N-1> in response to a flag signal FLAG and a strobe signal STROBE. The overflow preventing unit 410 controls the counting unit 420 to stop counting the output code OUT<0:N-1> when an overflow is about to occur.

Figure 1:
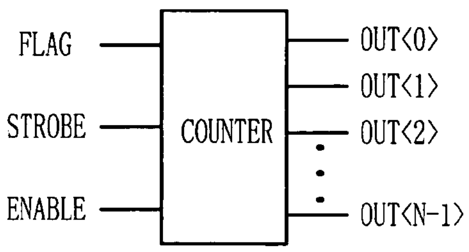
FIG. 1 (PRIOR ART)
FIG. 1 is a block diagram of a conventional N-bit counter.
Figure 2:
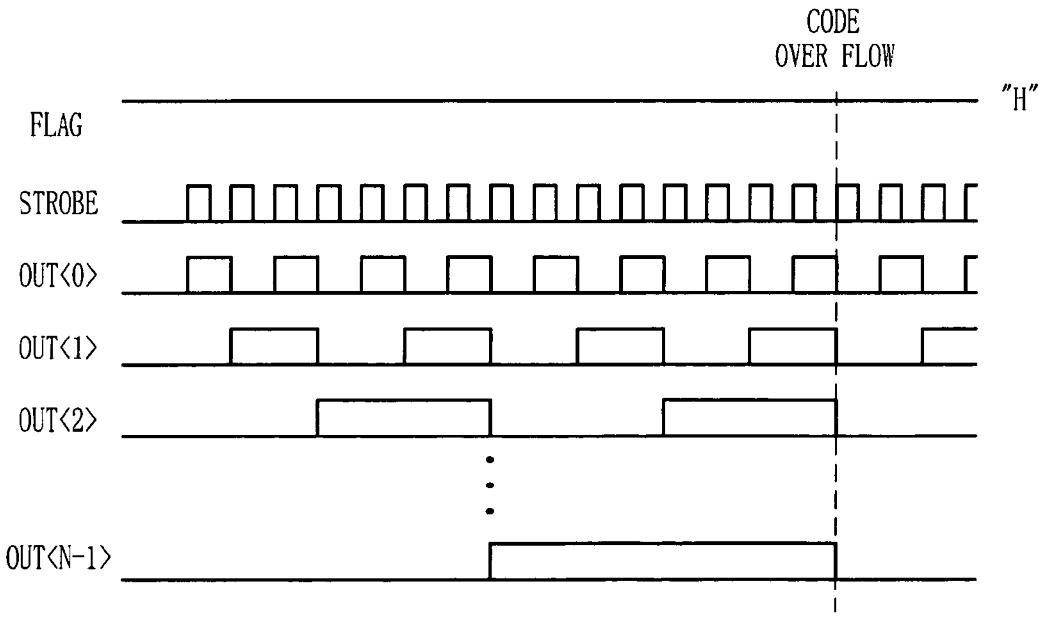
FIG. 2 (PRIOR ART)
FIG. 2 is a timing diagram illustrating a high overflow of the counter.
Figure 3:
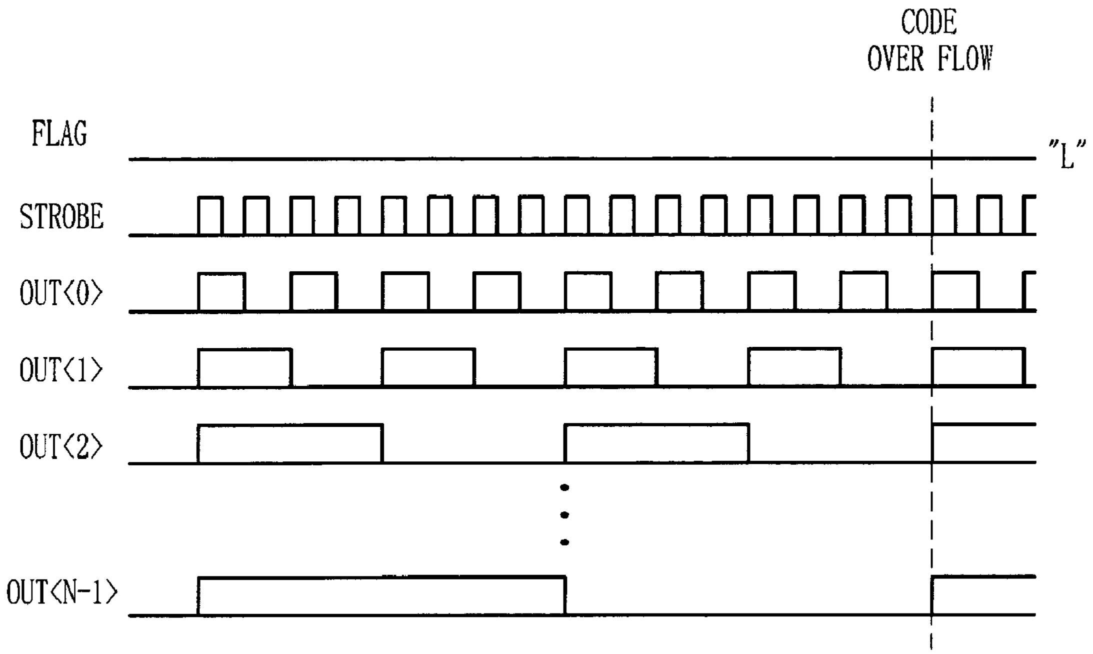
FIG. 3 (PRIOR ART)
FIG. 3 is a timing diagram illustrating a low overflow of the counter.

The counting unit 420 operates as a general counter that increases or decreases a code value of the output code in response to the flag signal FLAG and the strobe signal STROBE. The counting unit 420 is enabled or disabled by controlling of the overflow preventing unit 410. The counting unit 420 may be implemented with the counter of FIG. 1 or other types of counters. It is apparent to those skilled in the art that the counting unit 420 can be implemented by various methods. Thus, a detailed description about the design of the counting unit 420 will be omitted.

The overflow preventing unit 410 prevents the overflow by disabling the counting unit 420 immediately before an overflow occurs when the counting unit 420 counts the output code OUT<0:N-1>. The overflow preventing unit 410 can be designed to prevent either or both of a high overflow and a low overflow.

When the overflow preventing unit 410 is designed to prevent a high overflow, the overflow preventing unit 410 controls the counting unit 420 to stop counting the output code OUT<0:N-1> when the output code OUT<0:N-1> is a maximum value of, for example, 111 . . . 1 while it did not have the maximum value at a previous time.

When the overflow preventing unit 410 is designed to prevent a low overflow, the overflow preventing unit 410 controls the counting unit 420 to stop counting the output code OUT<0:N-1> when the output code OUT<0:N-1> is a minimum value of, for example, 000 . . . 0 while it did not have the minimum value at a previous time.

When the overflow preventing unit 410 is designed to prevent both the high overflow and the low overflow, the overflow preventing unit 410 controls the counting unit 420 to stop counting the output code OUT<0:N-1> when the output code OUT<0:N-1> is a maximum value or a minimum value while it did not have the maximum value or the minimum value at a previous time.

In all the three cases, the overflow preventing unit 410 gets feed back the output code OUT<0:N-1> from the counting unit 420, and determines whether the current output code OUT<0:N-1> is a maximum value or a minimum value. Thereafter, the overflow preventing unit 410 delays the determination result and determines whether the output code OUT<0:N-1> had a maximum value at a previous time. When the current value is the maximum value or the minimum value but was not at a previous time, the overflow preventing unit 410 controls the counting unit 420 to stop counting the output code OUT<0:N-1>. The "previous time" means a time that is taken to perform the counting one time.

Therefore, the counting operation of the counting unit 420 is stopped only when the output code OUT<0:N-1> is caused to have the minimum value or the maximum value by the counting. For example, when the output code OUT<0:N-1> is counted from "000 . . . 1" and finally is the minimum value "000 . . . 0", the overflow preventing unit 410 stops the counting operation of the counting unit 420. However, when the output code OUT<0:N-1> was "000 . . . 0" at a previous time and is still "000 . . . 0", the overflow preventing unit 410 does not stop the counting operation of the counting unit 420. Therefore, there is no problem in counting the output code OUT<0:N-1> while setting the maximum value or the minimum value as an initial value.

Figure 5:
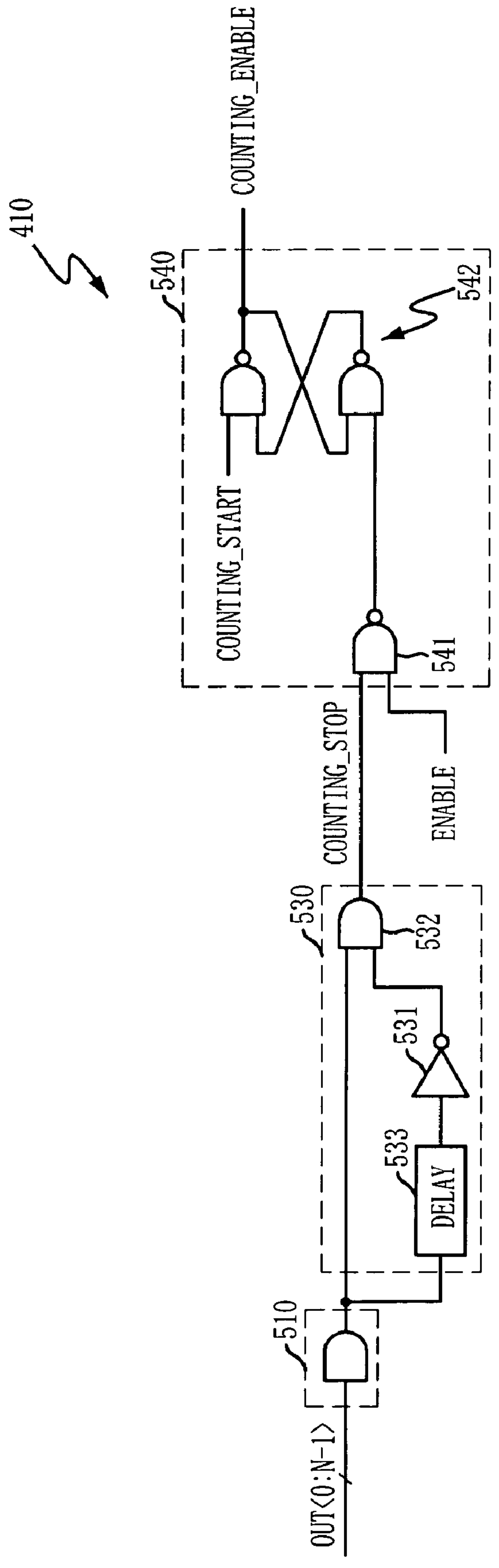
FIG. 5 is a circuit diagram of an overflow preventing unit for preventing a high overflow in accordance with an embodiment of the present invention.

FIG. 5 is a circuit diagram of an overflow preventing unit 410 for preventing a high overflow in accordance with an embodiment of the present invention.

Referring to FIG. 5, the overflow preventing unit 410 for preventing the high overflow includes a detecting unit 510 and a stop signal generating unit 530. The detecting unit 510 detects whether the output code OUT<0:N-1> is a maximum value. The stop signal generating unit 530 generates a counting stop signal COUNTING_STOP for stopping the counting operation of the counting unit 420 when the current value of the output code OUT<0:N-1> is at a maximum but its previous value is not at a maximum. The overflow preventing unit 410 further includes a controlling unit 540 generating a counting enable signal COUNTING_ENABLE for controlling the counting unit 420. The counting enable signal is enabled by the counting start signal COUNTING_START and is disabled by the counting stop signal COUNTING-_STOP.

Specifically, the detecting unit 510 includes an AND gate configured to receive the output code OUT<0:N-1>. The stop signal generating unit 530 may include a delay line 533, an inverter 531, and an AND gate 532. The delay line 533 is configured to delay the output signal of the detecting unit 510, and the inverter 531 is configured to invert the output signal of the delay line 533. The AND gate is configured to receive the output signal of the detecting unit 510 and the output signal of the inverter 531 to output the counting stop signal COUNTING_STOP. Further, the controlling unit 540 may include an SR latch 542 configured to output the counting enable signal COUNTING_ENABLE. The SR latch 542 is set in response to the counting start signal COUNTING_START and is reset in response to the counting stop signal COUNTING_STOP.

Upon operation of the detecting unit 510, the AND gate outputs a high level signal only when the output code OUT<0:N-1> is a maximum value. The stop signal generating unit 530 activates the counting stop signal COUNTING_STOP to a high level only when the output signal of the delay line 533 is a low level and the output signal of the AND gate 510 is a high level. At this point, the output signal of the delay line 533 corresponds to the detection result at a previous time. That is, the stop signal generating unit 530 activates the counting stop signal COUNTING_STOP to a high level only when the current value of the output code OUT<0:N-1> is the maximum value but its previous value is not the maximum value. Since the output of the detecting unit 510 is reflected on the output of the delay line 533 after a predetermined time, the counting stop signal COUNTING_STOP is a high pulse signal having a pulse width corresponding to the delay value of the delay line 533.

In other words, the counting stop signal COUNTING-_STOP is activated in a pulse form only when the current value of the output code OUT<0:N-1> is a maximum value but its previous value is not the maximum value.

The controlling unit 540 generates the counting enable signal COUNTING_ENABLE for controlling the enabling and disabling of the counting unit 420. The counting start signal COUNTING_START is a pulse signal that is activated to a low level when the counting unit 420 starts the counting operation. The enable signal ENABLE is a signal for determining whether to use the counting stop signal COUNTING-_STOP, that is, whether to perform the overflow prevention operation.

Upon operation of the controlling unit 540, the SR latch 542 activates the counting enable signal COUNTING_ENABLE to a high level when the counting start signal COUNTING_START is activated to a low level. Then, the counting stop signal COUNTING_STOP is activated to a high level in such a state that the enable signal ENABLE is activated, and thus the NAND gate 541 outputs a low level signal. Thus, the counting enable signal COUNTING_ENABLE is deactivated to a low level.

The counting unit 420 is enabled by the counting start signal COUNTING_START to perform the counting operation normally, and stops the counting operation when the counting stop signal COUNTING_STOP is activated, thereby preventing the occurrence of the overflow.

Figure 6:
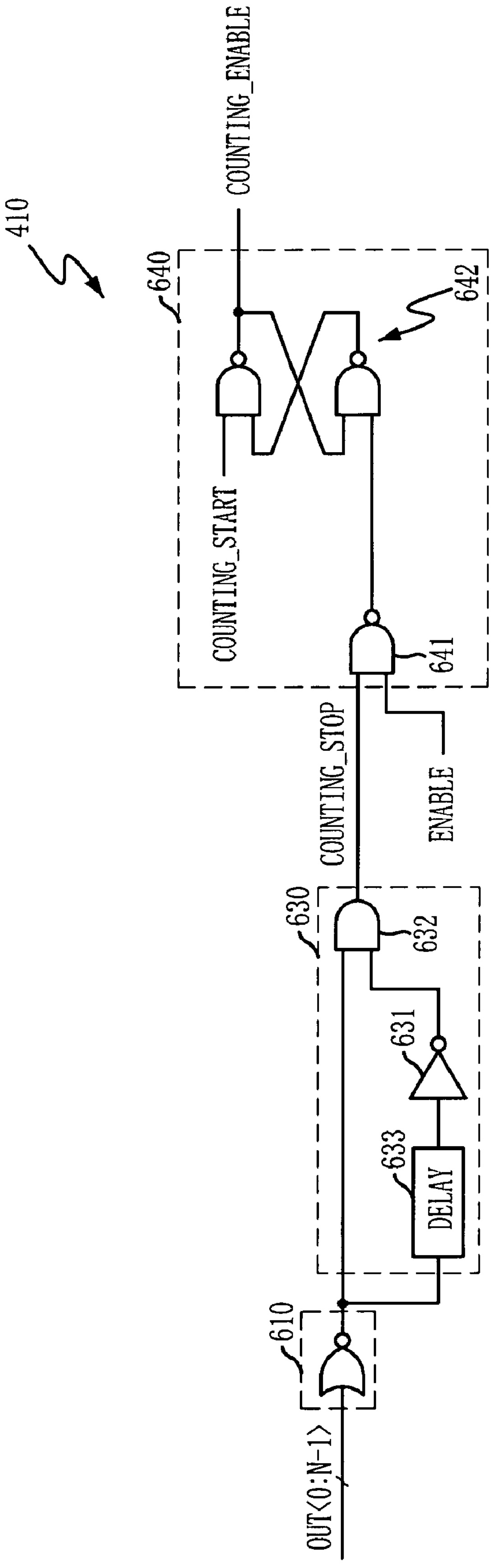
FIG. 6 is a circuit diagram of an overflow preventing unit for preventing a low overflow in accordance with an embodiment of the present invention.

FIG. 6 is a circuit diagram of an overflow preventing unit 410 for preventing a low overflow in accordance with an embodiment of the present invention.

Referring to FIG. 6, the overflow preventing unit 410 for preventing the low overflow includes a detecting unit 610 and a stop signal generating unit 630. The detecting unit 610 detects if the output code OUT<0:N-1> is a minimum value. The stop signal generating unit 630 generates a counting stop signal COUNTING_STOP for stopping the counting operation of the counting unit 420 when the current value of the output code OUT<0:N-1> is minimum and its previous value is not minimum. The overflow preventing unit 410 further includes a controlling unit 640 for controlling the counting unit 420. The controlling unit 640 has the same structure as the controlling unit 540 of FIG. 5.

Specifically, the detecting unit 610 includes a NOR gate configured to receive the output code OUT<0:N-1>. The stop signal generating unit 630 may include a delay line 633, an inverter 631, and an AND gate 632. The delay line 633 is configured to delay the output signal of the detecting unit 610, and the inverter 631 is configured to invert the output signal of the delay line 633. The AND gate is configured to receive the output signal of the detecting unit 610 and the output signal of the inverter 631 to output the counting stop signal COUNTING_STOP.

Upon operation of the detecting unit 610, the NOR gate outputs a high level signal only when the output code OUT<0:N-1> is a minimum value. The stop signal generating unit 630 activates the counting stop signal COUNTING_STOP to a high level only when the output signal of the delay line 633 is a low level and the output signal of the AND gate 610 is a high level. That is, the stop signal generating unit 530 activates the counting stop signal COUNTING_STOP to a high level only when the current value of the output code OUT<0:N-1> is the minimum value but its previous value is not the minimum value. Since the output of the detecting unit 610 is reflected on the output of the delay line 633 after a predetermined time, the counting stop signal COUNTING_STOP is a high pulse signal having a pulse width corresponding to the delay value of the delay line 633.

In other words, the counting stop signal COUNTING_STOP is activated to a high level only when the current value of the output code OUT<0:N-1> is a minimum value but its previous value is not the minimum value. The controlling unit 640 activates the counting enable signal COUNTING_ENABLE in response to the counting start signal COUNTING_START and deactivates it in response to the counting stop signal COUNTING_STOP. Since this operation is identical to that described with reference to FIG. 5, detailed description thereof will be omitted.

Figure 7:
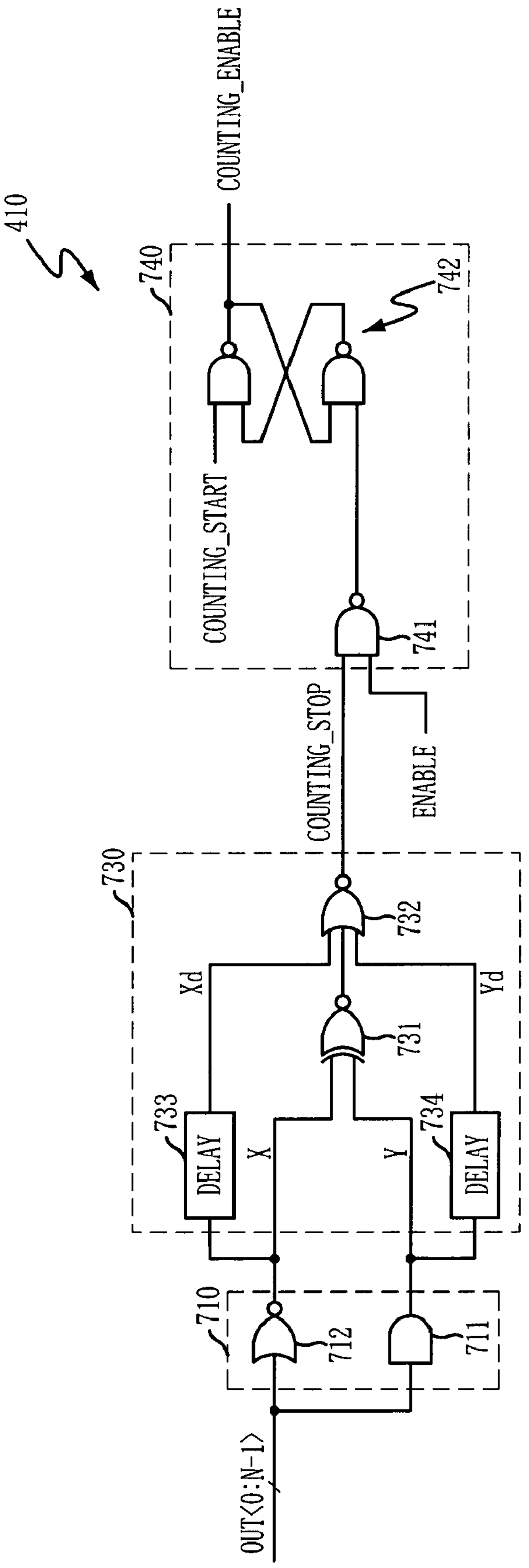
FIG. 7 is a circuit diagram of an overflow preventing unit for preventing a high overflow and a low overflow in accordance with an embodiment of the present invention.

FIG. 7 is a circuit diagram of an overflow preventing unit 410 for preventing both a high overflow and a low overflow in accordance with an embodiment of the present invention.

Referring to FIG. 7, the overflow preventing unit 410 for preventing both the high overflow and the low overflow includes a detecting unit 710 and a stop signal generating unit 730. The detecting unit 710 detects whether the output code OUT<0:N-1> is a maximum value or a minimum value. The stop signal generating unit 730 generates a counting stop signal COUNTING_STOP for stopping the counting operation of the counting unit 420 when the current value of the output code OUT<0:N-1> is a maximum or a minimum but its previous value is not a maximum or a minimum. The overflow preventing unit 410 further includes a controlling unit 740 for controlling the counting unit 420. The controlling unit 740 has the same structure as the controlling units 540 and 640.

Specifically, the detecting unit 710 includes an AND gate 711 configured to receive the output code OUT<0:N-1> to detect a maximum value, and a NOR gate 712 configured to receive the output code OUT<0:N-1> to detect a minimum value. The stop signal generating unit 730 includes an exclusive NOR (XNOR) gate 731 configured to receive an output signal of the AND gate 711 and an output signal of the NOR gate 712, a first delay line 733 configured to receive an output signal of the NOR gate 712, a second delay line 734 configured to receive an output signal of the AND gate 711, and a NOR gate 732 configured to receive an output signal of the XNOR gate 731, an output signal XD of the first delay line 733, and an output signal YD of the second delay line 734 to output the counting stop signal COUNTING_STOP.

The operation of the overflow preventing unit 410 will be described centering around nodes X, Y, XD and YD. The counting stop signal COUNTING_STOP outputted from the NOR gate 732 is activated only when logic levels of the nodes X, Y, XD, YD are 1, 0, 0 and 0, or 0, 0, 1 and 0. That is, the counting stop signal COUNTING_STOP is activated only when the current value of the output node OUT<0:N-1> is a maximum or a minimum but its previous value is not a maximum or a minimum. In this way, the overflow of the counting unit 420 can be prevented.

Figure 8:
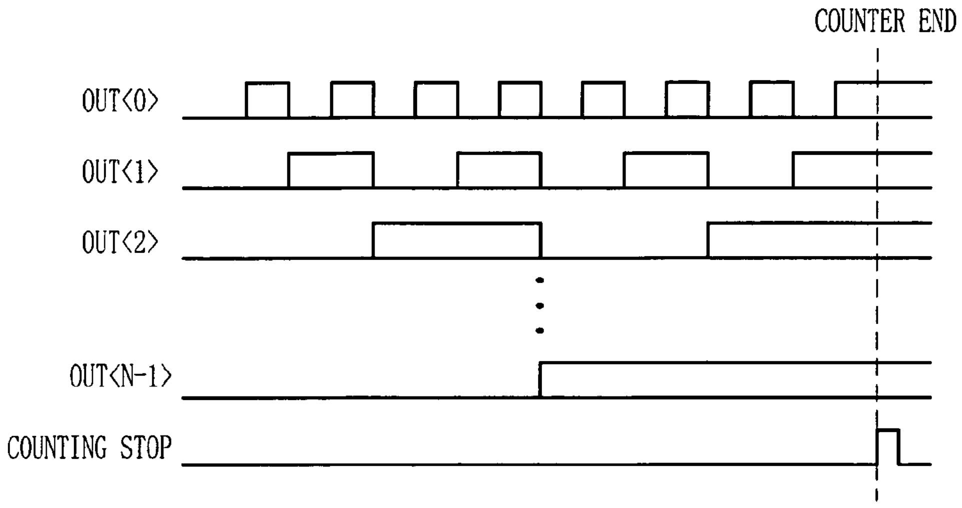
FIGS. 8 and 9 are timing diagrams illustrating the overflow prevention of the counter in accordance with an embodiment of the present invention.
Figure 9:
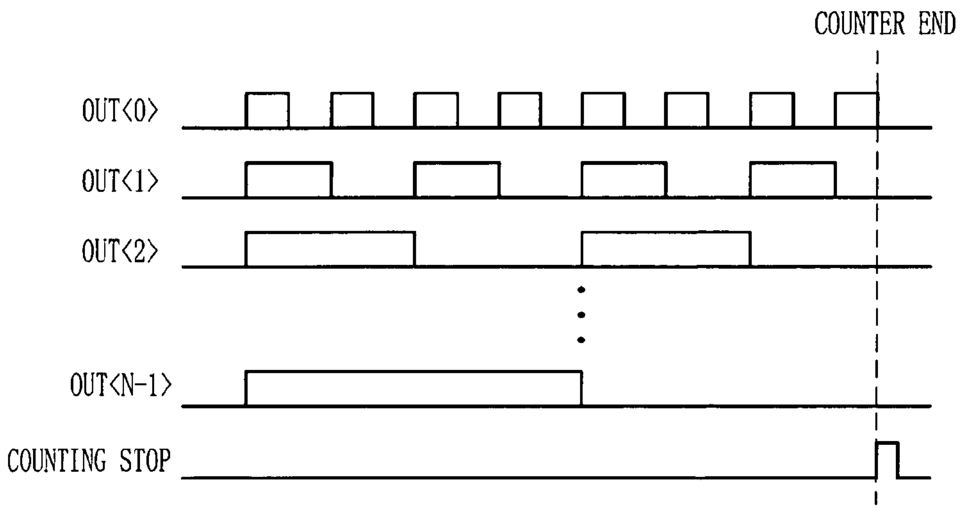

FIGS. 8 and 9 are timing diagrams illustrating the overflow prevention of the counter in accordance with an embodiment of the present invention.

It can be seen from FIG. 8 that the counting operation of the counter is stopped when the count value of the code OUT<0:N-1> is a maximum value "111 . . . 1". Also, it can be seen from FIG. 9 that the counting operation of the counter is stopped when the count value of the code OUT<0:N-1> is a minimum value "000 . . . 0".

In accordance with the embodiments of the present invention, the code overflow can be prevented because the counting operation of the counter is stopped when the code value of the counter is a maximum value or a minimum value.

The counting operation of the counter is not stopped simply because the code value is a maximum or a minimum value. The counting operation of the counter is stopped only when the current value of the output code is the maximum value or the minimum value but its previous value is not the maximum value or the minimum value. That is, the counting operation of the counting unit is stopped only when the output code is caused to have the minimum value or the maximum value by the counting. Therefore, there is no problem in counting the output code while setting the maximum value or the minimum value as an initial value.

While the present invention has been described with respect to the specific embodiments, it will be apparent to those skilled in the art that various changes and modifications may be made without departing from the spirit and scope of the invention as defined in the following claims.

What is claimed is:

1. A counter, comprising:

a counting unit configured to output an output code by counting an input signal; and an overflow preventing unit configured to control the counting unit to stop increasing the output code and hold a current value of the output code when the current value of the output code is a maximum value and a previous value of the output code is not the maximum value.

2. The counter as recited in claim 1, wherein the overflow preventing unit is configured to detect whether the current value of the output code is the maximum value, and delay the detected result to determine whether the previous value of the output code is the maximum value.

3. The counter as recited in claim 1, wherein the overflow preventing unit comprises:

a detecting unit configured to detect whether the current value of the output code is the maximum value; and a stop signal generating unit configured to activate a counting stop signal to stop a counting operation of the counting unit when the current value of the output code is the maximum value but the previous value thereof is not the maximum value.

4. The counter as recited in claim 3, wherein the detecting unit comprises an AND gate configured to receive the output code.

5. The counter as recited in claim 4, wherein the stop signal generating unit comprises:

a delay line configured to delay an output signal of the detecting unit;

an inverter configured to invert an output signal of the delay line; and an AND gate configured to receive an output signal of the detecting unit and an output signal of the inverter to output the counting stop signal.

6. The counter as recited in claim 3, wherein the overflow preventing unit further comprises a controlling unit configured to generate a counting enable signal for controlling the counting unit, the counting enable signal being enabled by a counting start signal and disabled by the counting stop signal.

7. The counter as recited in claim 6, wherein the controlling unit comprises an SR latch configured to output the counting enable signal, the SR latch being set in response to the counting start signal and reset in response to the counting stop signal.

8. A counter, comprising:

a counting unit configured to output an output code by counting an input signal; and an overflow preventing unit configured to control the counting unit to stop decreasing the output code and holds a current value of the output code when the current value of the output code is a minimum value and a previous value of the output code is not the minimum value.

9. The counter as recited in claim 8, wherein the overflow preventing unit is configured to detect whether the current value of the output code is the minimum value, and delay the detected result to determine whether the previous value of the output code is the minimum value.

10. The counter as recited in claim 8, wherein the overflow preventing unit comprises:

a detecting unit configured to detect whether the current value of the output code is the minimum value; and a stop signal generating unit configured to activate a counting stop signal to stop a counting operation of the counting unit when the current value of the output code is the minimum value but the previous value thereof is not the minimum value.

11. The counter as recited in claim 10, wherein the detecting unit comprises a NOR gate configured to receive the output code.

12. The counter as recited in claim 11, wherein the stop signal generating unit comprises:

a delay line configured to delay an output signal of the detecting unit;

an inverter configured to invert an output signal of the delay line; and an AND gate configured to receive an output signal of the detecting unit and an output signal of the inverter to output the counting stop signal.

13. The counter as recited in claim 10, wherein the overflow preventing unit further comprises a controlling unit configured to generate a counting enable signal for controlling the counting unit, the counting enable signal being enabled by a counting start signal and disabled by the counting stop signal.

14. The counter as recited in claim 13, wherein the controlling unit comprises an SR latch configured to output the counting enable signal, the SR latch being set in response to the counting start signal and reset in response to the counting stop signal.

15. A counter, comprising:

a counting unit configured to count an output code in response to an input signal; and an overflow preventing unit configured to control the counting unit to stop counting the output code and holds a current value of the output code when the current value of the output code is a maximum value or a minimum value and a previous value of the output code is not the maximum value or the minimum value.

16. The counter as recited in claim 15, wherein the overflow preventing unit is configured to determine whether the current value of the output code is the maximum value or the minimum value, and delay the detected result to determine whether the previous value of the output code is the maximum value or the minimum value.

17. The counter as recited in claim 15, wherein the overflow preventing unit comprises:

a detecting unit configured to determine whether the current value of the output code is the maximum value or the minimum value; and a stop signal generating unit configured to activate a counting stop signal to stop a counting operation of the counting unit when the current value of the output code is the maximum value or the minimum value but the previous value thereof is not the maximum value or the minimum value.

18. The counter as recited in claim 17, wherein the detecting unit comprises:

an AND gate configured to receive the output code; and a NOR gate configured to receive the output code.

19. The counter as recited in claim 18, wherein the stop signal generating unit comprises:

an exclusive NOR (XNOR) gate configured to receive an output signal of the AND gate and an output signal of the NOR gate;

a first delay line configured to delay an output signal of the NOR gate;

a second delay line configured to delay an output signal of the AND gate; anda NOR gate configured to receive an output signal of the XNOR gate, an output signal of the first delay line, and an output signal of the second delay line to output the counting stop signal.

20. The counter as recited in claim 17, wherein the overflow preventing unit further comprises a controlling unit configured to generate a counting enable signal for controlling the counting unit, the counting enable signal being enabled by a counting start signal and disabled by the counting stop signal.

21. The counter as recited in claim 20, wherein the controlling unit comprises an SR latch configured to output the counting enable signal, the SR latch being set in response to the counting start signal and reset in response to the counting stop signal.

* * * * *